(12) United States Patent
Zhang et al.

(10) Patent No.: US 9,040,421 B2
(45) Date of Patent: May 26, 2015

(54) METHODS FOR FABRICATING INTEGRATED CIRCUITS WITH IMPROVED CONTACT STRUCTURES

(71) Applicant: GLOBALFOUNDRIES, Inc., Grand Cayman (KY)

(72) Inventors: Xunyuan Zhang, Albany, NY (US); Xuan Lin, Watervliet, NY (US); Vimal Kamineni, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 27 days.

(21) Appl. No.: 13/887,174

(22) Filed: May 3, 2013

(65) Prior Publication Data

US 2014/0327140 A1    Nov. 6, 2014

(51) Int. Cl.
*H01L 21/44* (2006.01)
*H01L 21/768* (2006.01)
*H01L 23/48* (2006.01)

(52) U.S. Cl.
CPC .... *H01L 21/76843* (2013.01); *H01L 21/76802* (2013.01); *H01L 23/481* (2013.01)

(58) Field of Classification Search
CPC ................... H01L 21/76802; H01L 21/76843; H01L 27/10855; H01L 23/481

USPC .......... 438/618–624, 637–638, 672–673, 700
See application file for complete search history.

(56) References Cited

U.S. PATENT DOCUMENTS

| | | | |
|---|---|---|---|
| 7,608,537 B2 * | 10/2009 | Matsuo et al. | 438/672 |
| 8,471,365 B2 * | 6/2013 | Yamaguchi et al. | 257/615 |
| 2009/0093100 A1 * | 4/2009 | Xia et al. | 438/421 |
| 2009/0134520 A1 * | 5/2009 | Bright et al. | 257/751 |

\* cited by examiner

*Primary Examiner* — Dung A. Le
(74) *Attorney, Agent, or Firm* — Ingrassia Fisher & Lorenz, P.C.

(57) ABSTRACT

Methods for fabricating integrated circuits are provided. In an exemplary embodiment, a method for fabricating integrated circuits includes providing a semiconductor substrate disposed with a device therein and/or thereon. A contact structure including a barrier layer and a plug metal overlying the barrier layer is formed in electrical contact with the device. A hardmask is formed overlying the contact structure. The method includes performing an etch to form a via opening through the hardmask and to expose the barrier layer and the plug metal. Further, the method removes a remaining portion of the hardmask with a wet etchant, while the contact structure is configured to inhibit the wet etchant from etching the barrier layer. In the method, the via opening is filled with a conductive material to form an interconnect to the contact structure.

20 Claims, 4 Drawing Sheets

METHODS FOR FABRICATING INTEGRATED CIRCUITS WITH IMPROVED CONTACT STRUCTURES

TECHNICAL FIELD

The technical field generally relates to integrated circuits and methods for fabricating integrated circuits, and more particularly relates to integrated circuits and methods for fabricating integrated circuits with contact structures that inhibit etching of contact structure barrier layers.

BACKGROUND

Photoresist masks are commonly used in the semiconductor industry to pattern materials such as semiconductors or dielectrics. For example, photoresist masks are used in a dual damascene process to form metal interconnects during the back end of line (BEOL) metallization of a semiconductor device. The dual damascene process involves formation of a photoresist mask on a dielectric layer overlying a metal contact structure or metal conductive layer, such as a tungsten layer. The dielectric layer is then etched according to the photoresist mask to form a via and/or trench that expose the underlying metal contact structure or metal conductor layer. The via and trench, collectively known as a dual damascene structure, are typically defined using two lithography steps. After the lithography steps are performed, the photoresist mask is removed from the dielectric layer before a conductive material is deposited into the via and/or trench to form an interconnect.

As scaling of semiconductor devices continues, it becomes more difficult to achieve the necessary critical dimensions for vias and trenches. Thus, metal hardmasks are increasingly used to provide better profile control of vias and trenches. The metal hardmasks are typically made of titanium (Ti) or titanium nitride (TiN). A wet etching process is normally performed after forming the via and/or trench of the dual damascene structure to remove the metal hardmask. In the conventional process, it is desirable that the wet etching process use an etchant chemistry that effectively removes the metal hardmask without affecting the underlying metal conductor/barrier layers and dielectric material. In other words, the etchant chemistry is required to etch the metal hardmask at a much faster rate than it etches the metal conductor/barrier layers and dielectric layer.

However, titanium nitride is commonly used as both a metal hardmask and as a barrier metal, such as for tungsten contacts, in metal contact structures. Therefore, it may be difficult or impossible to use a wet etchant to selectively remove titanium nitride hardmasks after performing a dual damascene process that exposes a metal contact structure including a titanium nitride barrier metal. Specifically, the etchant will attack and form voids in the metal contact structure during removal of the metal hardmask. Alternatively, the same metals cannot be used for the metal hardmask and in the metal contact structure.

Accordingly, it is desirable to provide integrated circuits and methods for fabricating integrated circuits with improved contact structures. In addition, it is desirable to provide improved integrated circuits and improved methods for fabricating integrated circuits that inhibit etching of contact structure barrier layers during removal of hardmasks. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In one exemplary embodiment, a method for fabricating integrated circuits includes providing a semiconductor substrate disposed with a device therein and/or thereon. A contact structure including a barrier layer and a plug metal overlying the barrier layer is formed in electrical contact with the device. A hardmask is formed overlying the contact structure. The method includes performing an etch to form a via opening through the hardmask and to expose the barrier layer and the plug metal. Further, the method removes a remaining portion of the hardmask with a wet etchant, while the contact structure is configured to inhibit the wet etchant from etching the barrier layer. In the method, the via opening is filled with a conductive material to form an interconnect to the contact structure.

In accordance with another embodiment, a method is provided for fabricating an integrated circuit. The method for fabricating integrated circuits includes providing a semiconductor substrate disposed with a device therein and/or thereon. A contact structure including a barrier layer, a plug metal and a contact cap formed over the barrier layer and the plug metal is formed in electrical contact with the device. A hardmask is formed over the contact structure. The method includes etching the hardmask and dielectric layer to form a via opening through the hardmask and dielectric layer and to expose the contact cap of the contact structure, wherein the contact cap encapsulates the fill metal and the barrier layer. The method removes a remaining portion of the hardmask with a wet etchant, wherein the contact cap inhibits the wet etchant from etching the barrier layer. The method further includes filling the via opening with a conductive material to form an interconnect to the contact structure.

In another embodiment, an integrated circuit is provided. The integrated circuit includes a semiconductor substrate disposed with a device therein and/or thereon and a contact structure in electrical contact with the device. The contact structure includes a plug metal and a barrier layer that is selected from fluorine-free tungsten (FFW), tungsten carbide, and tungsten nitride. The integrated circuit further includes a dielectric material overlying the semiconductor substrate and an interconnect formed within the dielectric material and in electrical contact with the contact structure.

BRIEF DESCRIPTION OF THE DRAWINGS

Embodiments of integrated circuits and methods for fabricating integrated circuits with improved contact structures will be described in conjunction with the following drawing figures, wherein like numerals denote like elements, and wherein.

DETAILED DESCRIPTION

Figure 1:
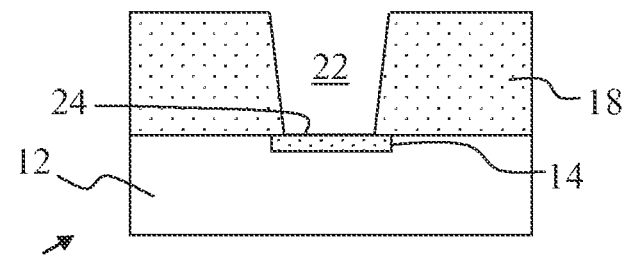
FIGS. 1-4 are cross-sectional views of a portion of an integrated circuit illustrating formation of a barrier layer and plug metal for electrical connection to a semiconductor device, and method steps for fabricating an integrated circuit in accordance with various embodiments herein.

The following detailed description is merely exemplary in nature and is not intended to limit the integrated circuits or the methods for fabricating integrated circuits claimed herein. Furthermore, there is no intention to be bound by any expressed or implied theory presented in the preceding technical field, background or brief summary, or in the following detailed description.

Integrated circuits and methods for fabricating integrated circuits with improved contact structures as described herein avoid issues faced by conventional processes for forming interconnects. For example, the methods described herein inhibit etching of contact structure barrier layers during interconnect via formation processes. Specifically, the methods described herein provide for use of a hardmask to etch a via, and for subsequent removal of the hardmask with a wet etchant. The methods described herein further inhibit etching by this wet etchant of the contact structure barrier layer exposed by the via etch.

In one embodiment, etching of the barrier layer is inhibited by forming the barrier layer from a material that is not etched, or is relatively slowly etched, by the wet etchant. For example, the barrier layer may be formed from fluorine free tungsten (FFW), tungsten nitride, or tungsten carbide. Use of a selected hardmask and of a wet etchant suitable for removing the selected hardmask will not cause etching of the barrier layer despite contact between the wet etchant and the barrier layer during the period of time necessary for the removal of the hardmask. In another embodiment, a conductive contact cap is formed overlying the contact structure barrier layer and plug metal after the contact structure barrier layer and plug metal are exposed by the via etch. As used herein, "overlying" includes both "on" and "over", such that the conductive cap may be directly on the contact structure barrier layer and plug metal, or separated from the contact structure barrier layer and plug metal by one or more other layers. After formation of the contact cap, the hardmask may be removed with a suitable wet etchant. Because the contact cap encapsulates the contact structure barrier layer and plug metal, the wet etchant cannot contact the contact structure barrier layer or plug metal during removal of the hardmask. In this embodiment, integrated circuits having contact structure barrier layers formed from the same material as the hardmask do not exhibit voids at or near the barrier layer top surface despite the hardmask wet etch removal process.

FIGS. 1-10 illustrate partially completed integrated circuits and methods for fabricating the partially completed integrated circuits in accordance with various embodiments. Various steps in the design and composition of integrated circuits are well known and so, in the interest of brevity, many conventional steps will only be mentioned briefly herein or will be omitted entirely without providing the known process details. Further, it is noted that integrated circuits include a varying number of components and that single components shown in the illustrations may be representative of multiple components.

In FIG. 1, in an exemplary embodiment, a method for fabricating an integrated circuit 10 begins by providing a semiconductor substrate 12. The semiconductor substrate 12 is preferably a silicon substrate (the term "silicon substrate" encompassing the relatively pure silicon materials typically used in the semiconductor industry as well as silicon admixed with other elements, such as germanium and the like). Alternatively, semiconductor substrate 12 can be realized as germanium, gallium arsenide, and the like, or the semiconductor substrate 12 can include layers of different semiconductor materials.

In FIG. 1, a device 14 is formed on and/or within the semiconductor substrate 12. For purposes of illustration, the device 14 may be a transistor including a gate structure (not shown) and active source/drain regions (not shown) formed on and/or within the semiconductor substrate 12. Metal silicide regions (not shown) may be formed on the gate structure and/or in the active source/drain regions.

In FIG. 1, a dielectric material 18 is formed over the device 14 and the semiconductor substrate 12. A contact opening 22 is etched into the dielectric material 18 to expose at least a portion of the device 14 at a contact site 24, for example at the gate electrode and/or active source/drain regions (including metal silicide regions, if utilized) of the device 14. Silicon oxide and silicon nitride (also lower-k materials like SiBCN) are exemplary dielectric materials 18. Deposition of these dielectric layers may be performed by chemical vapor deposition (CVD) or atomic layer deposition (ALD), by plasma and thermal enhanced. The dielectric material 18 is typically etched by a reactive ion etch (RIE).

Figure 2:
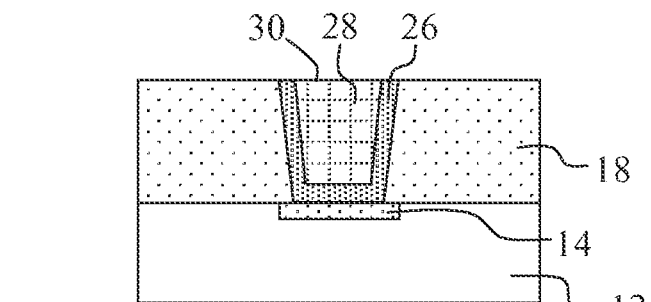

In FIG. 2, a barrier layer 26 is formed from a barrier material, such as titanium nitride or titanium nitride/titanium, deposited on the contact site 24 and along the sidewalls of the contact opening 22. Then, a plug metal 28, such as tungsten or cobalt, is deposited on the barrier metal 26 to fill the contact opening 22. As shown, the barrier layer 26 and plug metal 28 include a top surface 30. Typically, the barrier metal 26 and plug metal 28 are deposited with an overburden that is removed by chemical mechanical planarization (CMP) to provide the top surface 30 as shown.

Figure 3:
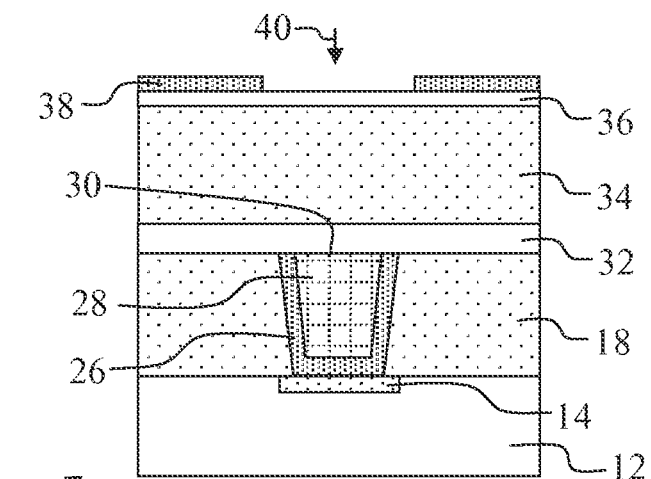

In FIG. 3, layers are formed over the semiconductor substrate 12. Specifically, in the exemplary method, a dielectric capping or passivation layer 32 is formed directly on the dielectric material 18 and on the top surface 30 of the barrier layer 26 and the plug metal 28. While the exemplary method forms the dielectric capping layer 32 directly on the top surface 30 of the barrier layer 26 and plug metal 28, other embodiments may utilize an intervening layer or layers between the capping layer 32 and the top surface 30. An exemplary dielectric capping layer 32 is a nitrogen-doped silicon carbide layer. Further, an interlayer dielectric 34 is formed over the capping layer 32. The interlayer dielectric 34 may be a low-k material or an ultra low-k or air gap material. For example, the interlayer dielectric 34 may be organosilicate glass and/or tetraethyl orthosilicate silicon oxide with/without pores. Further, the interlayer dielectric 34 may include more than one layer of dielectric material. As shown, a dielectric hardmask layer 36 is formed on the interlayer dielectric 34. An exemplary dielectric hardmask layer 36 is silicon oxide. While shown as separate layers, it is contemplated that interlayer dielectric 34 and dielectric hardmask layer 36 be formed as a single layer. Further, while dielectric layers 32, 34, and 36 are illustrated in FIG. 3, fewer or more dielectric layers may be utilized in the integrated circuit 10 as needed for processing.

FIG. 3 further illustrates hardmask 38 formed over semiconductor substrate 12. Specifically, hardmask 38 is deposited on the top dielectric layer, dielectric hardmask layer 36, and is patterned according to conventional lithography process steps. An exemplary hardmask 38 is titanium nitride. As shown, the hardmask 38 is selectively patterned to provide an exposed region 40 of the underlying layers 36, 34 and 32 over the top surface 30 of the barrier layer 26 and plug metal 28. Patterning of the hardmask 38 may be part of a dual damascene process for sequentially forming a trench or trenches and a via or vias in the dielectric layers 36, 34 and 32. Dual damascene processes are well known, and for ease of illustration and to avoid obscuring the present subject matter, they are not described in greater detail herein. In an exemplary embodiment, the patterning of the hardmask 38 occurs in a trench first metal hard mask (TFMHM) process.

Figure 4:
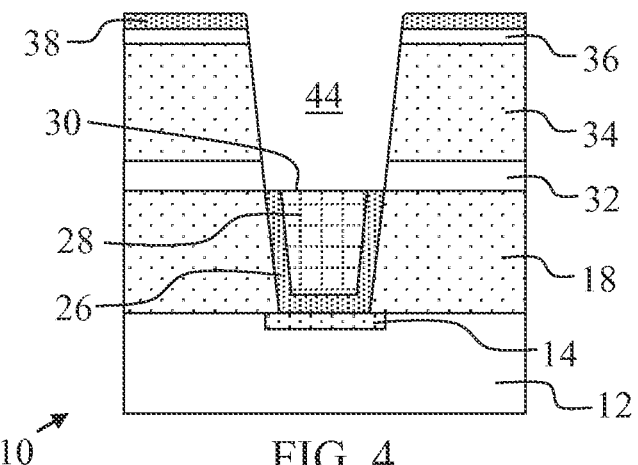

FIG. 4 shows the formation of a via opening 44 formed by etching the exposed region 40 of the dielectric layers 36, 34 and 32 using the hardmask 38 as a mask. An exemplary etching process is a reactive ion etch. The etch removes the dielectric layers 36, 34 and 32 above the surface 30 of the barrier layer 26 and the plug metal 28. The reactive ion etch does not etch the surface 30 of the barrier layer 26 and the plug metal 28. While the exemplary via opening 44 exposes the entire surface 30, it is contemplated that the via opening 44 expose only a portion of the surface 30.

Figure 5:
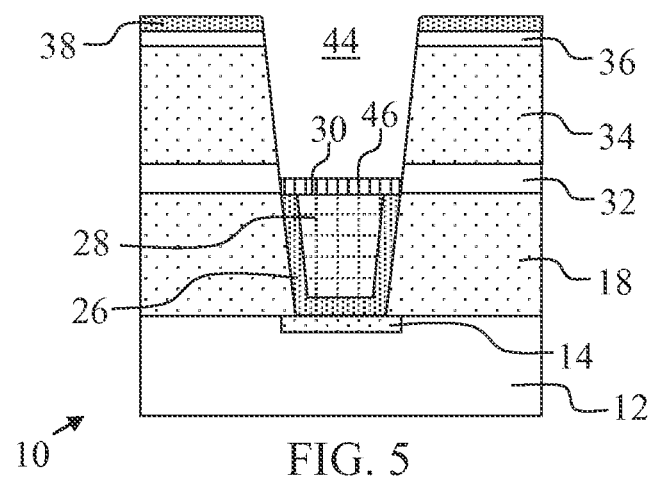
FIGS. 5-7 are cross-sectional views of the portion of the integrated circuit of FIGS. 1-4 illustrating an embodiment for inhibiting etching of the contact structure barrier layer.
Figure 6:
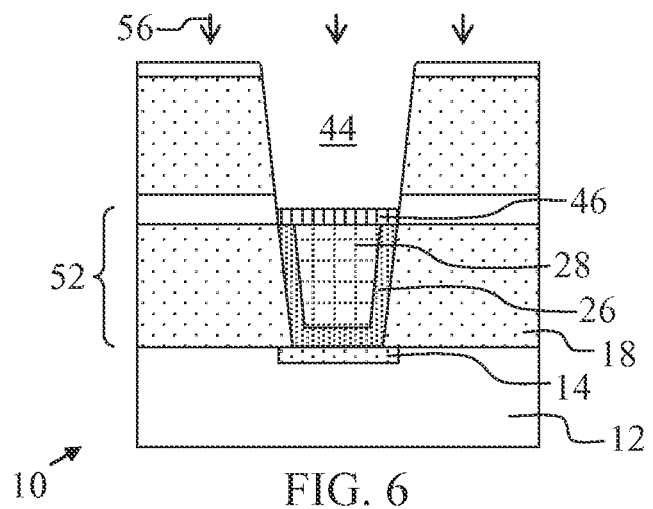
Figure 7:
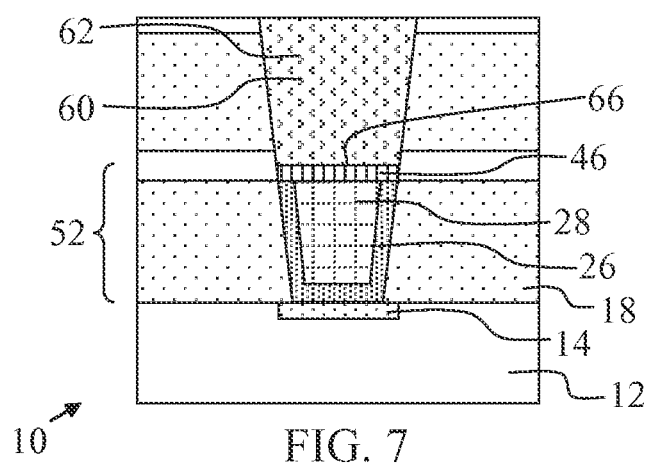

FIGS. 5-7 illustrate an embodiment of the method for fabricating an integrated circuit 10 which inhibits etching of the barrier layer 26. In the embodiment of FIGS. 5-7, a contact cap 46 is formed and encapsulates the barrier layer 26 and the plug metal 28. Specifically, in FIG. 5 the contact cap 46 is selectively grown on the plug metal. Due to the lateral and vertical growth of the cap 46 formed on the top surface 30 both the barrier layer 26 and plug metal 28 are encapsulated as shown in FIG. 5. An exemplary contact cap 46 may be an electrically conductive element or alloy, including, without limitation, tungsten, cobalt tungsten phosphide (CoWP), cobalt tungsten boride (CoWB), cobalt, nickel, nickel phosphide (NiP), palladium, and platinum. In an exemplary embodiment, the contact cap 46 is tungsten that is selectively formed on the surface 30 after formation of via opening 44 by chemical vapor deposition (CVD). As shown, the contact cap 46 forms over the entire exposed surface 30 between the sidewalls of the via opening 44 to encapsulate the barrier layer 26 and the plug metal 28 under the contact cap 46 and within the dielectric material 18. Notably, the contact cap 46 is not formed on the hardmask 38 or the dielectric layers 32 (other than adjacent surface 30), 34 or 36 because the deposition process is selective to the material of plug metal 28 as the vertical growth starts and followed by lateral growth to cover the barrier layer 26. In an exemplary embodiment, the contact cap 46 is formed with a thickness of about 1 nanometer (nm) to about 3 nm.

As shown in FIG. 6, in the embodiment of FIGS. 5-7, the barrier layer 26, plug metal 28 and contact cap 46 form a contact structure 52, such as a metal contact structure. Further, in FIG. 6, the hardmask 38 is removed from the partially completed integrated circuit 10. Specifically, the hardmask 38 is selectively etched using an appropriate wet etchant, indicated by arrows 56. For example, the exemplary wet etchant 56 includes an oxidizer, such as hydro peroxide; a pH adjuster, such as ammonia; and/or a tungsten corrosion inhibitor. Such a wet etchant 56 is appropriate for use with a tungsten contact cap 46 as it etches tungsten relatively slowly, such as less than about 5 Angstrom per minute (A/m), and etches titanium nitride relatively quickly, such as about 50 A/m to about 60 A/m. An exemplary etchant has 1:10 selectivity between the cap and the hardmask. The etchant attacks and removes the hardmask 38 but the contact cap 46 is substantially impervious to, or at least not completely etched through in any location by, the wet etchant 56 for at least the duration of time it takes to remove the hardmask 38. For example, it has been found that the cap contact 46 resists attack by the wet etchant 56 for at least two minutes. As a result, the barrier layer 26 of the contact structure 52 is protected from the wet etchant 56. This is particularly beneficial when the hardmask 38 and the barrier layer 26 are formed from the same material, such as titanium nitride, or from different materials that are etched by the wet etchant 56 at similar rates. Structurally, the barrier layer 26 and the plug metal 28 are encapsulated by the cap contact 46. As a result, the barrier layer 26 and the plug metal 28 are physically separated from the wet etchant 56.

In FIG. 7, a conductive via 60 is formed by depositing a conductive material, such as copper, into the via opening 44 to form a metal interconnect 62. As shown, the conductive via 60 abuts an upper surface 66 of the contact cap 46. As the exemplary contact cap 46 is electrically conductive, the conductive via 60 is in electrical communication with the device 14 through the barrier layer 26 and the plug metal 28. Further processing may include formation of additional metallization layers to complete the metal interconnect 62 and/or other back end of line (BEOL) process steps.

As shown, the integrated circuit 10 of FIG. 7 includes a contact structure 52 connected to a device 14 overlying a semiconductor substrate 12, and including an electrically conductive contact cap 46 formed on a barrier layer 26 and plug metal 28, and a conductive via 60 electrically connected to the contact structure 52. As described above, the integrated circuit 10 exhibits improved metal integrity in the contact structure 52, as attack by the wet etchant 56 is inhibited. This is particularly beneficial when the contact structure 52 includes a barrier layer 26 that is of the same composition as the hardmask 38, such as when both are titanium nitride, or when the barrier layer 26 and the hardmask 38 are etched by the wet etchant 56 at similar rates. Further, the use of the contact cap 46 provides for a broader range of wet etchants 56 to select for removing the hardmask 38 as concerns related to etching of or damage to the contact structure 52 are reduced or eliminated.

Figure 8:
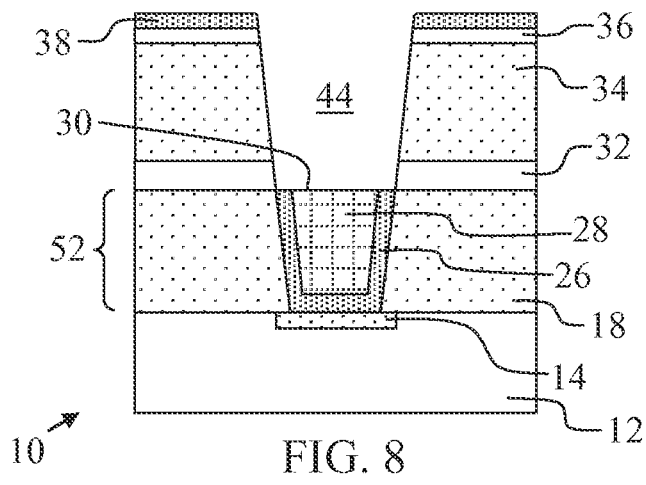
FIGS. 8-10 are cross-sectional views of the portion of the integrated circuit of FIGS. 1-4 illustrating another embodiment for inhibiting etching of the contact structure barrier layer.
Figure 9:
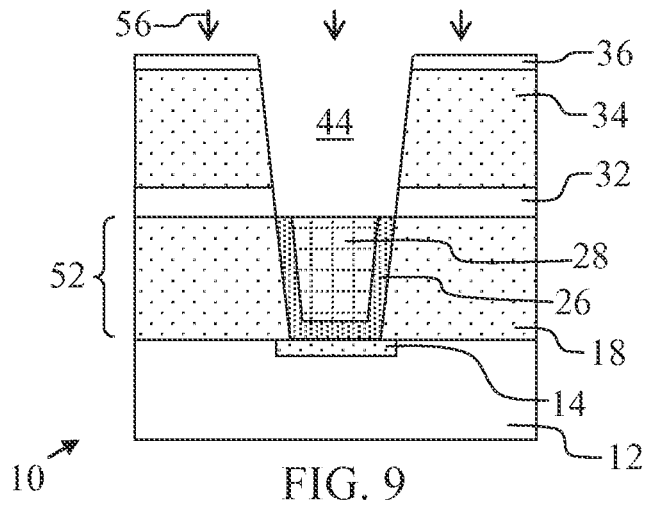
Figure 10:
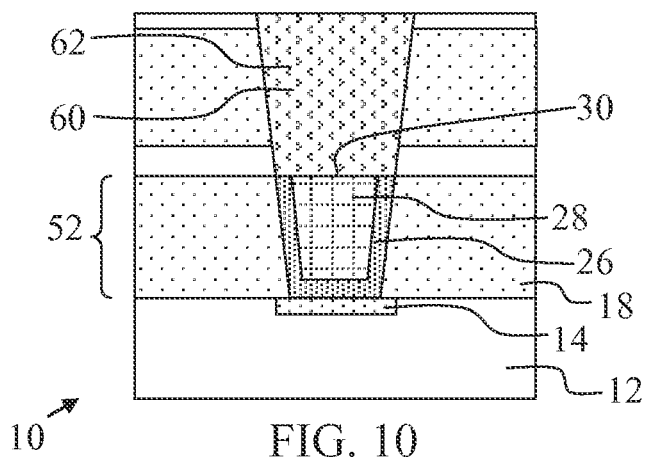

Referring now to FIGS. 8-10, another embodiment of the method for fabricating an integrated circuit 10 which inhibits etching of the barrier layer 26 is illustrated. For the embodiment of FIGS. 8-10, formation of the barrier layer 26 in FIG. 2 requires a specific material or materials. Specifically, in FIG. 2, the barrier layer 26 is formed in the contact opening 22 from a selected material that is etched relatively slowly by the wet etchant 56 (relative to the etching rate of the hardmask 38) In an exemplary embodiment, the barrier layer 26 is fluorine free tungsten (FFW) or tungsten nitride or tungsten carbide. These tungsten-based materials forming the barrier layer 26 may be deposited on the sidewalls of the contact opening 22 by atomic layer deposition (ALD), by plasma or thermal hydrogen treatment.

In an exemplary ALD process, the partially completed integrated circuit 10 is exposed to a non-halogen organometallic tungsten precursor and a reducing agent (such as hydrogen) to deposit a fluorine free tungsten-rich film (which may can contain carbon and nitrogen) forming the barrier layer 26 in the contact opening 22. Further, the ALD process may expose the partially completed integrated circuit 10 to a tungsten-containing precursor to deposit one or more tungsten layers on the tungsten-rich film, such that the tungsten-rich film and the one or more tungsten layers form the barrier layer 26.

After formation of the tungsten-based barrier layer 26, an exemplary plug metal 28 is formed by substantially filling the contact opening 22 with tungsten. Thereafter, a CMP process may be utilized to remove any overburden of barrier layer 26 and plug metal 28 outside of the contact opening 22. The processes described with reference to FIG. 3 then form the dielectric layers 32, 34 and 36, as well as patterned hardmask 38.

As shown in FIG. 8, an etch process such as a reactive ion etch is performed with the patterned hardmask 38 as a mask. As a result, via opening 44 is formed and exposes the top surface 30 of the barrier layer 26 and the plug metal 28. In the embodiment of FIGS. 8-10, the barrier layer 26 and the plug metal 28 form the contact structure 52 with surface 30 as the top surface of the contact structure 52.

In FIG. 9, the hardmask 38 is removed from the partially completed integrated circuit 10. Specifically, the hardmask 38 is selectively etched using an appropriate wet etchant, indicated by arrows 56. For example, the exemplary wet etchant 56 includes an oxidizer, a pH adjuster and/or a tungsten corrosion inhibitor. Such a wet etchant 56 is appropriate for use with a FFW, tungsten nitride, or tungsten carbide barrier layer 26 and tungsten plug metal 28 as it etches tungsten relatively slowly, such as less than about 5 Angstrom per minute (A/m), and titanium nitride relatively quickly, such as about 50 A/m to about 60 A/m. An exemplary etchant has 1:10 selectivity between the barrier layer/plug metal and the hardmask. The etchant attacks and removes the hardmask 38 but the contact structure 52 is substantially impervious to, or at least not substantially etched in any location by, the wet etchant 56 for at least the duration of time it takes to remove the hardmask 38. For example, it has been found that the contact structure 52 resists attack by the wet etchant 56 for at least two minutes. Because the barrier layer 26 and plug metal 28 are resistant to the wet etchant 56, there is no need to cap or encapsulate the barrier layer 26 and the plug metal 28.

In FIG. 10, a conductive via 60 is formed by depositing a conductive material, such as copper, into the via opening 44 to form a metal interconnect 62. As shown, the conductive via 60 is formed on the surface 30 of the contact structure 52. The conductive via 60 is in electrical communication with the device 14 through the barrier layer 26 and the plug metal 28. Further processing may include formation of additional metallization layers to complete the metal interconnect 62 and/or other back end of line (BEOL) process steps.

As shown, the integrated circuit 10 of FIG. 10 includes a contact structure 52 connected to a device 14 within and overlying a semiconductor substrate 12, and including a barrier layer 26 and plug metal 28, and a conductive via 60 electrically connected to the contact structure 52. As described above, the integrated circuit 10 exhibits improved metal integrity in the contact structure 52, as attack by the wet etchant 56 is inhibited by the use of an etch resistant barrier layer 26. Further, the use of the selected material, such as FFW, for the barrier layer 26 provides for a broader range of wet etchants 56 from which to select for removing the hardmask 38 as concerns related etching of or damage to the contact structure 52 are reduced or eliminated.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application

What is claimed is:

1. A method for fabricating integrated circuits, the method comprising:

providing a semiconductor substrate disposed with a device therein and/or thereon;

forming a contact structure in electrical contact with the device, wherein the contact structure includes a barrier layer and a plug metal overlying the barrier layer;

forming a hardmask overlying the contact structure;

performing an etch to form a via opening through the hardmask and to expose the barrier layer and the plug metal;

after performing the etch to form the via opening through the hardmask, forming a contact cap on the fill metal and barrier layer;

removing a remaining portion of the hardmask with a wet etchant, wherein the contact cap inhibits the wet etchant from etching the barrier layer; and filling the via opening with a conductive material to form an interconnect to the contact structure.

2. The method of claim 1 wherein forming a hardmask over the contact structure comprises forming a titanium nitride hardmask over the contact structure.

3. The method of claim 1 further comprising depositing dielectric material over the semiconductor substrate, wherein forming a contact structure comprises:

etching a contact opening through the dielectric material;

depositing a barrier material in the contact opening to form the barrier layer; and depositing a fill metal over the barrier layer to form the plug metal filling the contact opening.

4. The method of claim 1 further comprising:

depositing a dielectric material over the contact structure, wherein performing the etch to form the via opening comprises etching the dielectric material to form the via opening therethrough, wherein forming the contact cap on the fill metal and barrier layer comprises selectively depositing tungsten in the via opening on the fill metal and laterally growing the tungsten to cover the barrier layer.

5. The method of claim 1 wherein removing a remaining portion of the hardmask with a wet etchant comprises removing a remaining portion of the hardmask with an etchant including an oxidizer, a pH adjustor and/or a tungsten corrosion inhibitor.

6. The method of claim 1 further comprising:

depositing a dielectric material over the contact structure, wherein performing the etch to form the via opening comprises etching the dielectric material to form the via opening therethrough, wherein forming the contact cap on the fill metal and barrier layer comprises selectively depositing tungsten in the via opening on the fill metal and laterally growing the tungsten into contact with the dielectric material to cover the barrier layer.

7. The method of claim 1 wherein forming a contact structure in electrical contact with the device comprises depositing fluorine free tungsten (FFW), tungsten nitride, or tungsten carbide to form the barrier layer.

8. The method of claim 7 wherein removing a remaining portion of the hardmask with a wet etchant comprises removing a remaining portion of the hardmask with a wet etchant selective to titanium nitride over FFW, such that the contact structure is configured to inhibit the wet etchant from etching the barrier layer.

9. The method of claim 7 further comprising depositing dielectric material over the semiconductor substrate, wherein forming a contact structure comprises:

etching a contact opening through the dielectric material; and exposing the substrate to a non-halogen organometallic tungsten precursor and a reducing agent to deposit a tungsten-rich film in the contact opening, wherein the tungsten-rich film is the barrier layer.

10. The method of claim 9 wherein forming a contact structure further comprises substantially filling the contact opening with tungsten to form the plug metal.

11. The method of claim 7 further comprising depositing dielectric material over the semiconductor substrate, wherein forming a contact structure comprises:
   etching a contact opening through the dielectric material;
   exposing the semiconductor substrate to a non-halogen organometallic tungsten precursor and a reducing agent to deposit a tungsten-rich film in the contact opening;
   exposing the substrate to a tungsten-containing precursor to deposit one or more tungsten layers on the tungsten-rich film, wherein the tungsten-rich film and the one or more tungsten layers form the barrier layer.

12. The method of claim 11 wherein forming a contact structure further comprises substantially filling the contact opening with tungsten to form the plug metal.

13. A method for fabricating integrated circuits, the method comprising:
   providing a semiconductor substrate disposed with a device therein and/or thereon;
   forming a contact structure in electrical contact with the device, wherein the contact structure includes a barrier layer and a plug metal;
   forming a dielectric layer and a hardmask over the contact structure;
   etching the hardmask and dielectric layer to form a via opening through the hardmask and dielectric layer and to expose the contact structure;
   forming a contact cap in the via opening over the plug metal and the barrier layer;
   removing a remaining portion of the hardmask with a wet etchant, wherein the contact cap inhibits the wet etchant from etching the barrier layer; and
   filling the via opening with a conductive material to form an interconnect to the contact structure.

14. The method of claim 13 wherein forming the contact cap on the barrier layer and the plug metal comprises selectively growing the contact cap from the plug metal into contact with the dielectric layer to cover the barrier layer.

15. The method of claim 13 further comprising depositing dielectric material over the semiconductor substrate, wherein forming a contact structure comprises:
   etching a contact opening through the dielectric material;
   depositing a barrier material in the contact opening to form the barrier layer; and
   depositing a fill metal over the barrier layer to form the plug metal, wherein the plug metal fills the contact opening.

16. The method of claim 13 wherein forming the contact cap in the via opening over the fill metal and barrier layer comprises selectively depositing tungsten on the fill metal and covering the barrier layer by lateral growth of the tungsten.

17. A method for fabricating integrated circuits, the method comprising:
   providing a semiconductor substrate disposed with a device therein and/or thereon;
   forming a contact structure in electrical contact with the device, wherein forming the contact structure includes depositing fluorine free tungsten (FFW), tungsten nitride, or tungsten carbide to form a barrier layer and forming a plug metal overlying the barrier layer;
   forming a hardmask overlying the contact structure;
   performing an etch to form a via opening through the hardmask and to expose the barrier layer and the plug metal;
   removing a remaining portion of the hardmask with a wet etchant, wherein the contact structure is configured to inhibit the wet etchant from etching the barrier layer; and
   filling the via opening with a conductive material to form an interconnect to the contact structure.

18. The method of claim 17 wherein removing a remaining portion of the hardmask with a wet etchant comprises removing a remaining portion of the hardmask with a wet etchant selective to titanium nitride over FFW, such that the contact structure is configured to inhibit the wet etchant from etching the barrier layer.

19. The method of claim 17 wherein forming the contact structure in electrical contact with the device comprises depositing fluorine free tungsten (FFW) to form the barrier layer.

20. The method of claim 17 wherein forming the contact structure in electrical contact with the device comprises depositing tungsten carbide to form the barrier layer.

* * * * *